United States Patent [19]
Allen

[11] 4,135,104
[45] Jan. 16, 1979

[54] REGENERATOR CIRCUIT

[75] Inventor: Reginald A. Allen, Topanga, Calif.

[73] Assignee: TRW, Inc., Redondo Beach, Calif.

[21] Appl. No.: 856,780

[22] Filed: Dec. 2, 1977

[51] Int. Cl.² .................. H01L 27/10; H01L 29/78; H03K 19/08; H03K 5/18
[52] U.S. Cl. .................. 307/221 D; 307/216; 307/264; 307/DIG. 3; 364/862; 365/183; 365/222; 357/24
[58] Field of Search .................. 307/203, 216, 221 D, 307/243, 264, DIG. 1, DIG. 3; 357/24; 364/862; 365/222, 183

[56] References Cited

U.S. PATENT DOCUMENTS

| | | | |
|---|---|---|---|
| 3,777,186 | 12/1973 | Chang | 307/304 |
| 3,919,564 | 11/1975 | Walden | 357/24 X |
| 3,937,985 | 2/1976 | Cooper, Jr. | 307/221 D |
| 3,986,059 | 10/1976 | Mohsen | 307/221 D X |
| 3,989,956 | 11/1976 | Walden | 307/221 D |
| 4,047,051 | 9/1977 | Heller | 307/221 D |
| 4,048,519 | 9/1977 | Hoffmann et al. | 307/DIG. 3 X |
| 4,082,963 | 4/1978 | Hoffman | 307/DIG. 1 X |

OTHER PUBLICATIONS

Chou, "Design of a 16384-Bit Serial Charge-Coupled Memory Device"; *IEEE Trans. on Electron Devices*, vol. ED-23, No. 2, pp. 78-86; Feb. 1976.

Dennard, "Regeneration Circuit for Charge-Coupled Device Shift Register", *IBM Tech. Discl. Bull.*; vol. 14, No. 12, pp. 3791-3792; May 1972.

Anantha, "Charge Sensing Circuit Using Charge Amplification"; *IBM Tech. Discl. Bull.*; vol. 18, No. 12, pp. 4019-4020; May 1976.

*Primary Examiner*—Larry N. Anagnos
*Attorney, Agent, or Firm*—Fraser and Bogucki

[57] ABSTRACT

The problem of gradual dissipation of charge in charge packets in charge-coupled devices (CCDs) as the packets are successively shifted is overcome by a regenerator circuit which also provides a basic structure for effecting elemental logic and arithmetic functions. A standardized charge packet is injected along with a digitally valued but somewhat diminished charge packet into a potential well under a storage electrode arranged to retain a single charge packet. Overflow from the storage electrode region that represents only some part of a full charge packet is detected by a master sensing gate that controls a slave gate forming a shunt path for the full charge packet and that is normally maintained in a transfer state. The slave gate shifts to a barrier state when the overflow packet is present, however, permitting the full charge packet to advance along another electrode path. Consequently, when a diminished charge packet having an assigned binary value is applied to the regenerator circuit, a full charge packet representing the same binary value is transferred out, and without inversion. In the absence of a charge packet at the binary input indicating the alternate binary value, the unitary charge under the storage electrode is directed out the shunt path. Advantageous arrangements are provided for in-line transfer of the data signal, sequential advance of the charge packets and dissipation of charge residues. By appropriate use of additional input transfer gates and output transfer gates, the regenerator circuit serves as a basic unit which can provide fundamental logical and digital functions needed in digital systems, including OR gates, AND gates, EXCLUSIVE-OR gates, half adders and full adders.

14 Claims, 7 Drawing Figures

GRAPHICAL REPRESENTATION CLOCK VOLTAGES AND TIMING

POTENTIAL DIAGRAM AT VARIOUS POINTS IN TIME ALONG THE MASTER CCD CHANNEL

POTENTIAL DIAGRAM AT VARIOUS POINTS IN TIME ALONG THE SLAVE CCD CHANNEL

POTENTIAL DIAGRAM AT VARIOUS POINTS IN TIME ALONG THE REFRESH CHANNEL

REGENERATOR CIRCUIT

The Government has rights in this invention pursuant to Contract N00014-74-C-0068 awarded by the Department of the Navy.

BACKGROUND OF THE INVENTION

Since the original analytical and experimental work on charge-coupled devices (CCDs) in semiconductor technology, significant effort has been expended toward improving the devices themselves and applying the devices to large scale systems. Thus CCDs have for some time been used in analog applications, but more recently have successfully been adapted to digital memories and digital signal processors. Particular advantages arise for a number of system configurations, because of the extremely low power requirements and high density properties of the CCD in comparison to other forms of large scale integration.

The CCD comprises a capacitive semiconductor device having a potential well which can not only store an incremental packet of charge but which can transfer that charge packet to an adjacent similar device. Thus, in a digital system, the presence or absence of a substantially full charge in a potential well conveniently represents one or the other binary state, and data storage and transfer operations are readily implemented. CCDs are particularly advantageous for systems in which sequential processing and storage of long chains of binary values are important, as in many real time processing and analysis systems. However, there are transfer inefficiencies at each storage site, so that a continuously diminishing charge packet would be transferred if the charge packet were not restored or regenerated periodically to its full level. The CCD is essentially a metal-oxide semiconductor capacitor that is biased by an electrical field to create a substrate region that acts as a localized potential minimum for mobile carriers in a charge packet. Transfer of the mobile charge carriers to an adjacent storage site is effected by proper interrelationships between the voltages on adjacent electrodes, so that moving potential wells are established which ultimately carry the charge packets to a device at which their presence or absence is sensed. Although the present description relates to a particular example of a system using negative bias for the potential wells under the electrodes, it will be appreciated by those skilled in the art that either polarity may be used in accordance with whatever substrate is selected. Similarly, it will be recognized that practice of the invention is not dependent upon use of any particular fabrication technique, such as the use of buried channels as opposed to surface channels.

The transfer inefficiencies result from unavoidable imperfections in semiconductor and device manufacture, and a number of workers in the art have confronted the problem in different ways. The common expedient is to insert active elements in the system, but this not only substantially increases the power requirements but requires that a substantial amount of area be devoted to the regeneration function. It is of course desirable that the signal-to-noise ratio be adequately high to correspond to the very high reliability demanded of digital systems. Thus, a charge packet can only be allowed to diminish to that level at which it may reliably be regenerated without more than a negligible chance of an error occurring, as determined by system reliability requirements. Obviously, however, the lower the charge packet can be relative to the 100% level, without affecting reliability, the fewer the number of regenerators that need be used and the greater the packing density of the CCD array. Similarly, the digital system must incorporate a great many logical and arithmetic gates, and its packing density can be substantially increased if automatic regeneration functions can be incorporated directly into these gates, or at least a substantial proportion of them as needed.

The prior art as to regenerator devices is exemplified by U.S. Pat. Nos. 4,048,519, 4,047,051 and 3,986,059. The prior art on logic devices is exemplified by U.S. Pat. No. 3,777,186. As pointed out in a patent application entitled "Logic Gate Utilizing Charge Transfer Deviced", Ser. No. 724,140, filed Sept. 17, 1976 and assigned to the assignee of the present application, the circuit of U.S. Pat. No. 3,777,186 is subjected in practice to a race condition and the erroneous transfer of charge which substantially diminishes the reliability of the circuit. In the aforementioned application, transfer gates and control gates are employed in conjunction with what is termed a charge sensing amplifier. The charge sensing amplifier incorporates a master gate and an interrelated slave gate to control output transfer of charge packets whose presence or absence indicates the appropriate binary value. Although arithmetic and logic functions are provided, charge regeneration must be effected separately.

SUMMARY OF THE INVENTION

A regenerator circuit for CCDs in accordance with the invention receives both a data-representative charge packet (or no charge packet if the opposite binary state exists) and a standardized or second data-representative charge packet in the potential well under a storage electrode which is configured to retain only a unitary charge packet. Overflow is directed into a separate channel and the overflow charge packet biases a gating device which is intercoupled in shunt fashion with the output charge transfer path for the packet under the storage electrode. Without an overflow condition, the output transfer gate is at a transfer level and the charge packet under the storage electrode is shifted out the shunt path, thus indicating the binary state in which no input charge packet was applied. An overflow charge packet of diminished charge from the storage electrode, however, is sufficient to cause the biasing system to shift the output transfer gate from a transfer to a barrier state, thus outputing the full stored charge packet corresponding to the other binary input value. The system is fully compatible with CCD fabrication technology, and the circuit may be arranged in compact, in-line fashion.

Further in accordance with the invention, the regenerator circuit advantageously includes means for generating a standardized charge packet including a diode feeding a pair of differentially biased transfer electrodes which couple serially between the diode and the storage electrode. When gated on, a charge packet of preselected minimum potential is injected under the successive transfer electrodes, but when the diode is gated off its acts as a sink and withdraws charge to the minimum potential level defined by the adjacent transfer electrode. Thus only a standardized charge packet determined by the difference in bias levels remains under the second of the transfer electrodes, for entry into the storage electrode region. Further, diode means may be coupled to the master gate portion of a sensing gate in the circuit, to dissipate residual charges, whatever the binary state of the input signal.

In accordance with other features of the invention, the basic regenerator circuit, together with added input and output transfer gates, functions concurrently to provide a variety of digital functions as well as data packet regeneration. In each instance, however, charge packet overflow is arranged to bias the output transfer of a full charge packet. In these circuits, different logical and arithmetic functions may be provided including OR gates, AND gates, EXCLUSIVE-OR gates, inverters, half adders and full adders, usually in paired combinations which simplify system design.

BRIEF DESCRIPTION OF THE DRAWINGS

A better understanding of the invention may be had by reference to the following description, taken in conjunction with the accompanying drawings, in which.

DETAILED DESCRIPTION

Figure 1:
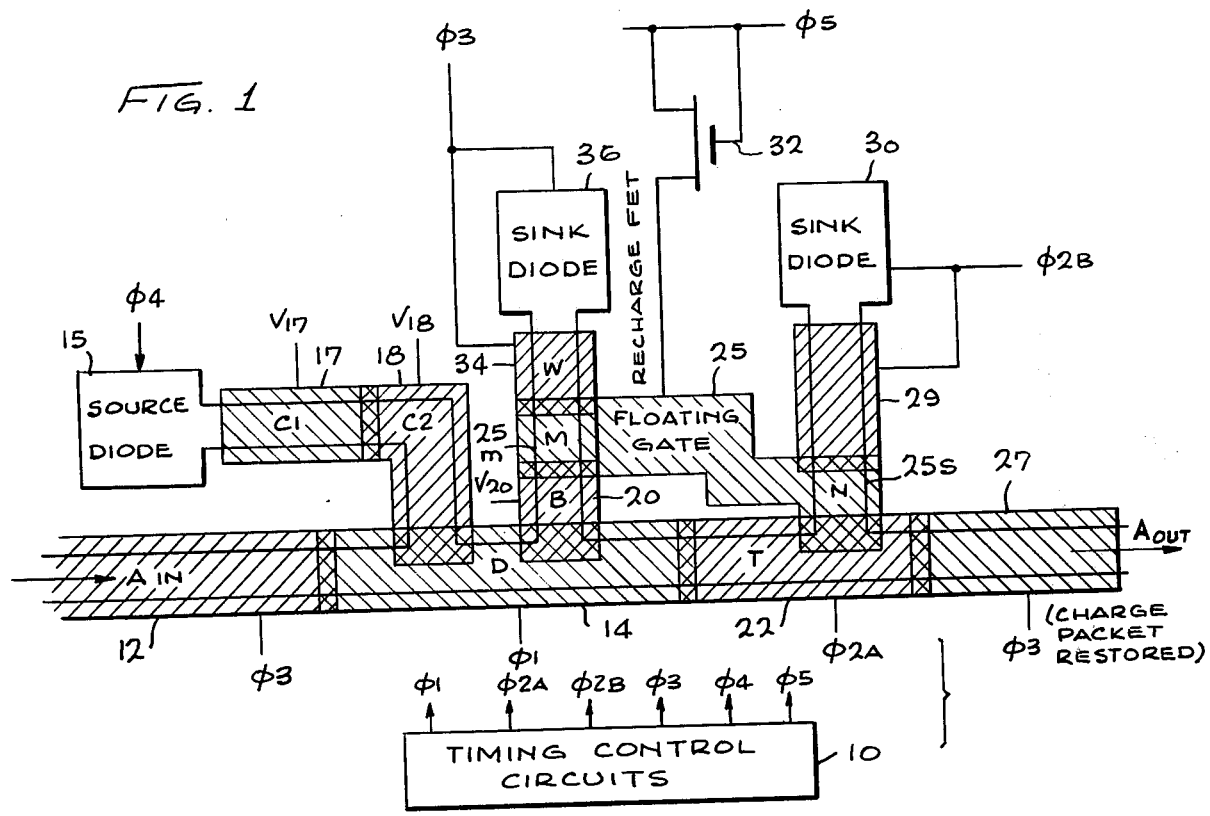
FIG. 1 is a simplified schematic and block diagram plan view of a regenerator circuit in accordance with the invention.

The example of FIG. 1 depicts a practical example of a regenerator circuit, arranged to linearly shift an input charge packet $A_{in}$ along a signal path to provide a regenerated (also sometimes referred to as a refreshed or restored) full amplitude output charge packet $A_{out}$. The output charge packet may have diminished to as little as 50% of its nominal level in previous charge transfers, although this degree of diminution is not generally to be permitted and would probably be limited to buried channel devices in any event. To regenerate a full nominal charge packet level for subsequent processing, a basic transfer channel and gating arrangement is shown that is readily adaptable to a wide variety of logic functions, while also being easily fabricated and being relatively immune to spurious charge accumulations and signal variations.

Figure 2:
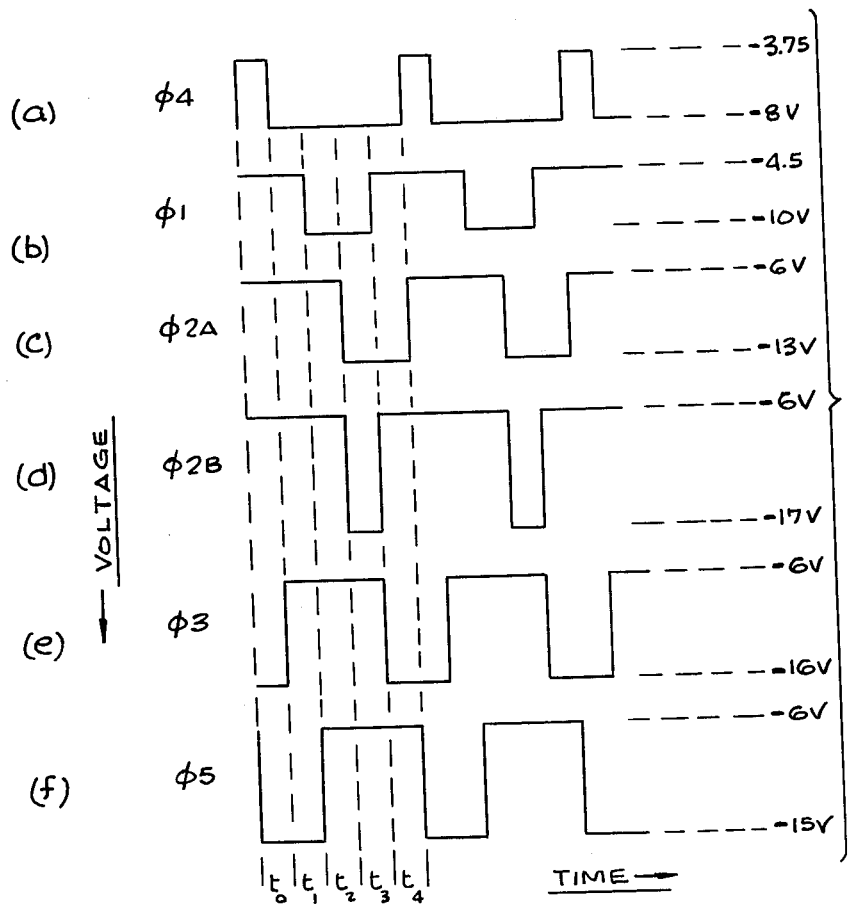
FIG. 2 is a graphical representation of clock voltages, timing waveforms and bias levels utilized in the arrangement of FIG. 1.

In FIG. 1, the input charge packet $A_{in}$ is derived from a conventional source such as a shift register or gate electrode (not shown). In the system, as is conventional, timing control circuits 10 generate a sequence of phase signals of different negative-going potential, as shown in FIG. 2, and here designated as phase one ($\phi 1$), phase two ($\phi 2$) ... and so forth. The input data charge packet $A_{in}$ is received at an input transfer gate 12 when $\phi 3$ goes to its most negative level, coincident with output transfer of the immediately previous regenerated charge packet. This partial overlap minimizes time delay in the pipe line processing that is characteristic of CCDs, and is permissible because there is no interaction between charge packets at any electrode or gate. The input charge packet $A_{in}$ is subject to prior diminution because of the various capacitance and transfer effects, and is thus held in the potential well under the transfer gate 12, where it can go no further with $\phi 3$ at its most negative level because a storage electrode 14 to which the transfer gate is coupled is held at a high (less negative) bias level and acts as a barrier. In FIG. 1, the successive gates are represented in simplified plan view and with crosshatching to depict the overlap between adjacent elements. The principal transfer channels are represented by pairs of parallel, spaced apart, lines. It is to be understood that FIG. 1 represents an idealized view and is not intended to show segments of a semiconductor substrate (the latter being conventional and thus omitted for purposes of simplicity).

Concurrently with input of $A_{in}$, a source diode 15 is gated on during the most negative level of $\phi 4$ to inject a charge into a serially disposed pair of differently biased transfer gates 17, 18, the second of which is also coupled to the storage electrode 14. The source diode 15 appears as a negative source to the coupled transfer gates 17, 18, which are biased in this example with $-6$ volts and $-8$ volts respectively, these bias levels being designated $V_{17}$ and $V_{18}$ respectively. The transfer gates 17, 18 receive charge thereunder but are unable to transfer charge packets to the storage electrode 14 which is then at a more positive level. When the source diode 15 is no longer driven, it appears as a current sink, drawing back charge from under the gates 17, 18 to a minimum potential corresponding to that of the first gate 17. However, the differential charge packet under gate 18, which is defined by the difference in bias levels on gates 17 and 18, remains under the more negatively biased gate 18. Consequently a standardized charge packet (which may be designated as Q or unity charge) is available under the second transfer gate 18. This is a known technique for generating a charge packet, and is sometimes referred to as the "fill and spill" method.

The charge packet corresponding to $A_{in}$ will, for descriptive purposes, be assumed to be approximately 0.75 Q, although it may be in the range from 0.50 Q to 1.00 Q.

When the storage electrode 14 is driven negatively to its minimum potential level, e.g. $-10$ volts, the charge packets under the transfer gates 12 and 18 are shifted into the storage electrode 14 region. However, the storage electrode 14 is arranged to have an area and a minimum potential such that only a unity charge Q can be stored in its potential well, the excess immediately being transferred into a coupled overflow barrier gate 20. Overflow transfer is achieved by biasing the overflow barrier gate 20 to a suitable level $V_{20}$, which, in this example, is $-9$ volts. The storage electrode 14 is also coupled in line with a control transfer gate 22 which receives the standardized charge packet Q that remains under the storage electrode 14 when one part of the $\phi 2$ signal, here designated $\phi 2A$, is subsequently applied. Transfer from the control transfer gate 22 is then governed by a floating or sensing gate 25 having a master gate portion 25m coextensive with a portion of the overflow transfer gate 20 and a slave gate portion 25s coextensive with a portion of the output transfer gate 22. Alternatively, the master gate portion may be fabricated as a floating diffusion to perform a like function. As described in the above referenced application, the floating gate 25 functions such that the existence of a charge packet under its master gate portion 25m creates a potential level under its slave gate portion 25s that controls subsequent charge transfer by acting as a barrier gate. In the present circuit, the slave gate portion 25s is disposed as an available shunt path to the control transfer gate 22, which is coupled in line with output transfer gate 27. If this shunt path is a barrier, then during the more negative level of $\phi 3$, the unity charge packet held under the control transfer gate 22 is transferred out as a fully regenerated package $A_{out}$ of the same binary value as $A_{in}$. If the shunt path is not a barrier in the absence of an overflow, then at the second part of $\phi 2$, here termed $\phi 2B$, the unity charge packet is shunted from the control transfer gate 22 via the slave gate portion 25s, now functioning in the transfer mode. The shunted charge is directed, in this example, to a sink diode 30 via a gate electrode 29, both of which receive the $\phi 2B$ signal.

A recharge field effect transistor 32 is coupled to the floating gate 25 and receives a gating signal designated $\phi 5$, which gates the FET on, recharging the floating gate 25 to a selected level. The master gate portion 25m may contain a residual charge packet at the completion of data regeneration, and this is dissipated through a transfer gate 34 coupled in operative relation to the master gate portion 25m and coupled in turn to a sink diode 36, both of these elements being activated by the more negative level of $\phi 3$.

As may be seen generally from the timing diagrams and the bias levels depicted in FIG. 2, in conjunction with FIG. 1, the circuit operates by utilizing the constant insertion of a standarized charge packet from the source diode 15 and the coupled transfer gates 17, 18, along with the presence or absence of a diminished binary valued charge packet $A_{in}$ at the input transfer gate 12, to create a deliberate overflow condition at the storage electrode 14. The presence of the overflow condition applied through the transfer gate 20 to the master gate portion 25m determines that the shunt path which includes the slave gate portion 25s will not be used to transfer the charge packet through the transfer gate 29 to the sink diode 30. The absence of the data input charge packet leaves only the standardized charge packet under the storage electrode 14, which in turn dictates that the floating gate 25 does not sense an overflow condition. In consequence the slave gate 25s is in the transfer state, and the standardized charge packet shifted into the control transfer electrode 22 at $\phi 2A$ is immediately shifted out at $\phi 2B$, and the absence of a charge packet is detected by the associated output circuits as the $A_{out}$ signal at $\phi 3$. Conversely, if overflow is not detected, the normal bias on the floating gate 25 causes the slave gate portion 25s to act in a barrier mode, so that the standardized charge packet is shifted successively through the control transfer electrode 22 to the output transfer electrode 27 as the $A_{out}$ signal. Thus the true value of the input signal is regenerated, without inversion, and in a linear transfer sequence with a compact geometry that can entirely be achieved with large scale integration techniques.

Examples of actual phase timing signals and voltage used in one practical version of the system of FIG. 1 are shown in FIG. 2. All phase signals vary between two different negative levels in this instance, with the less negative-going level constituting the barrier state and the more negative-going level constituting the transfer state. It can be seen that the phase signals are referenced to five successive time increments $t_0$, $t_1$ ... $t_4$, but that they are not in progressive order or discretely separated. Thus the negative-going portions overlap and are of different durations so that charge packet transfer is effected in minimum time.

Figure 3:
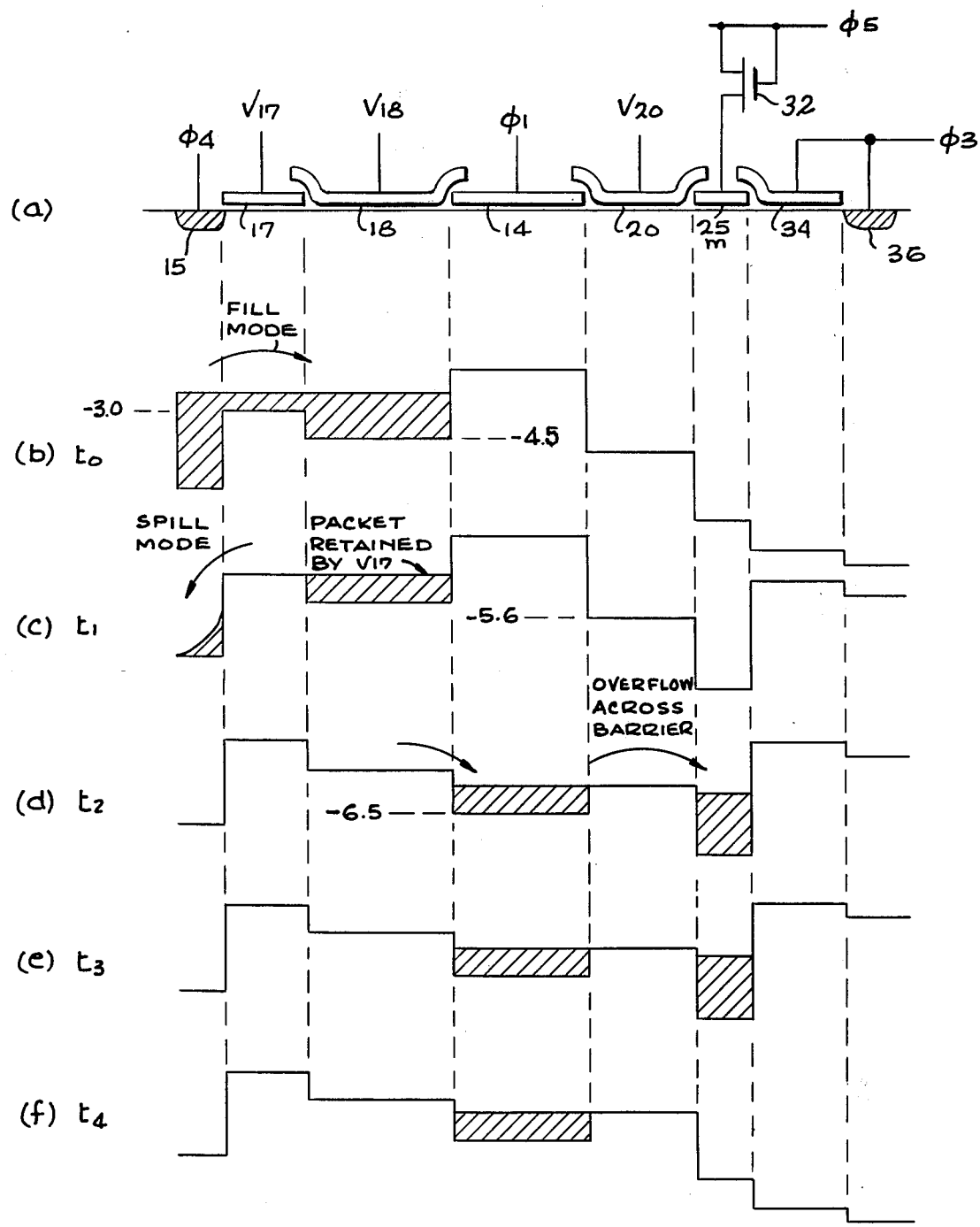
FIG. 3 is a simplified graphical representation of bias levels and minimum potentials utilized in one channel in the arrangement of FIG. 1.

It can also be seen that the negative-going portions, which establish minimum potentials for charge transfer, are progressively deeper within the circuit as the packets are advanced toward the output end. The potential diagrams of FIGS. 3, 4 and 5, which show the barrier levels and potential wells along different cros-sections of the substrate corresponding to different transfer channels, graphically depict charge packet movement along these channels. Thus, for the $t_0$ ... $t_5$ time frame, FIG. 3 represents changes in potentials along the various elements and electrodes in the master gate CCD channel. Actual surface potentials are given for various gates, but there is a differential between the surface potentials shown in FIGS. 3, 4 and 5 and those applied, as given in FIG. 1. This differential, which is well known to those skilled in the art, arises from the fact that applied gate voltage must overcome a threshold level (here approximately -2.5 volts) before a surface potential appears, although the relationship between applied gate voltage and surface potential thereafter is substantially linear. Thus for different gate bias levels (e.g. $V_{17}$) or phase signals (e.g. $\phi 1$), the following surface potentials are given by way of example:

$V_{17} = -6v$, then $V_s = -3v$
$V_{18} = -8v$, then $V_s = -4.75v$
$V_{20} = -9v$, then $V_s = -5.6v$
$\phi 1 = -10v$, then $V_s = -6.5v$ Consequently when the source diode 15 region is at its least negative-going level at time $t_0$ (waveform b in FIG. 3), the bias level $\phi 4$ creates a surface potential that is about 1v above (less negative than) the $-3.0v$ surface potential under the first gate 17. This provides a charge flow that more than fills the potential well under the second gate 18, but is drained off to the barrier level of the first gate 17 when $\phi 4$ goes to its most negative level at $t_1$. During this time the storage electrode 14 is biased with a gate potential ($\phi 1$) of -4.5v, giving a surface potential of approximately -1.7v, which acts as a barrier. When $\phi 1$ is taken more negative, to give a surface potential of -6.5v at the start of $t_2$, the packet retained under the second gate 18 is entered in this potential well (diagram d) while any overflow goes across the barrier of the transfer gate 20, into the potential well under the master gate portion, 25m. The next time increment $t_3$ marks the start of the negative-going portion of $\phi 2$, which does not affect the stored packets in this channel (see diagram e). At the start of $t_4$, however, the negative-going portion of $\phi 3$ applied to the transfer gate 34 and the sink diode 36 dissipates the overflow charge in this example.

Figure 4:
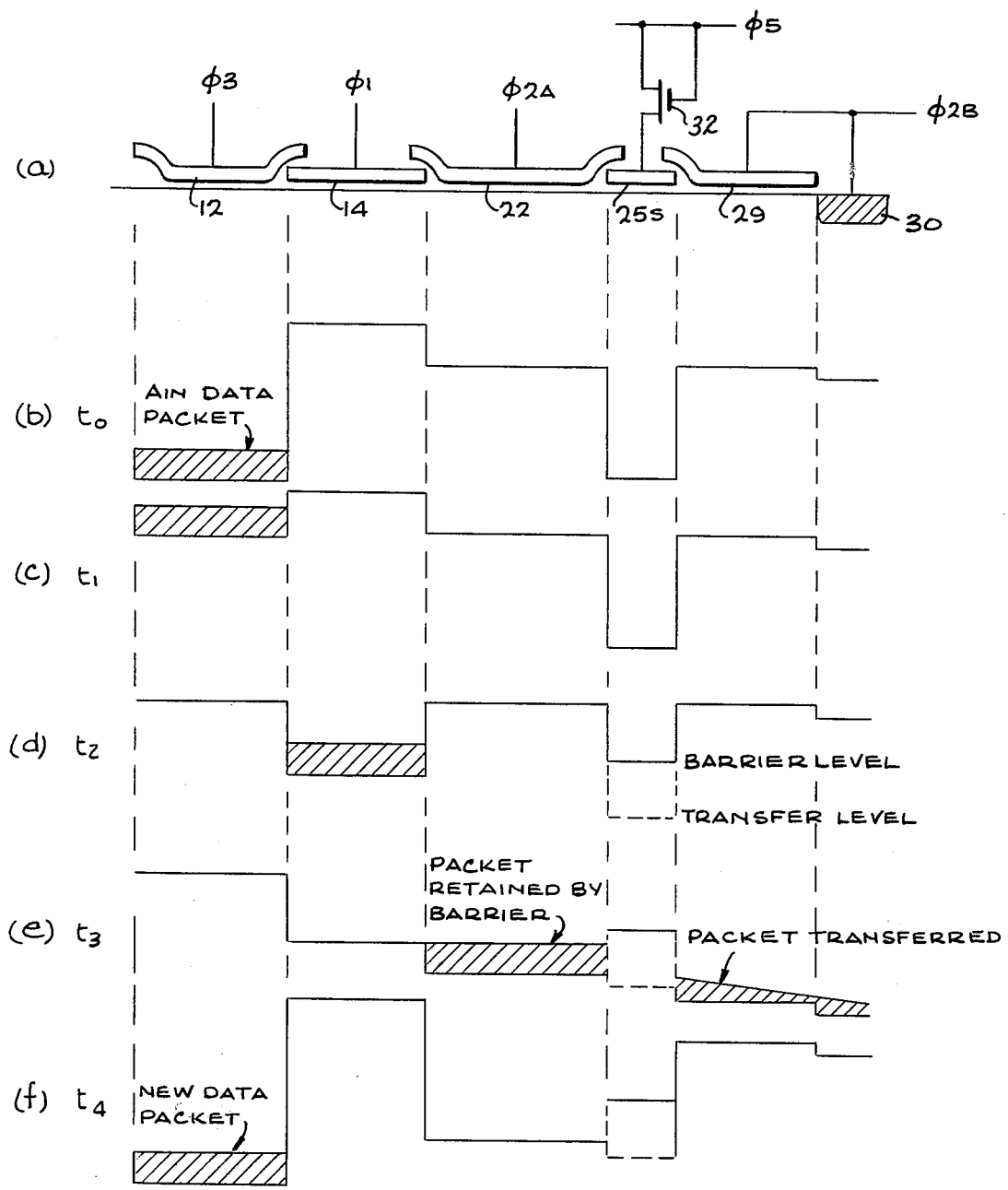
FIG. 4 is a simplified graphical representation of bias levels and minimum potentials utilized in a second channel in the arrangement of FIG. 1.

The charge packet under the storage electrode 14 is separately transferred out along the slave CCD channel, as shown by the comparable potential diagrams in FIG. 4. Here the $A_{in}$ data packet held available from the associated shift register is immediately inserted under the transfer gate 12 at $t_0$ (diagram b) because $\phi 3$ is then at its most negative level. At the start of $t_1$, the potential well under gate 12 is raised (diagram c), but not sufficiently to overcome the barrier of the surface potential under storage electrode 14 until the start of $t_2$, when the $\phi 1$ potential goes more negative (diagram d). Downstream of the storage electrode 14, the slave gate portion 25s of the floating gate assumes either a barrier level (if overflow was not present) or a transfer level (if overflow was present). Thus, when the $\phi 2B$ goes more negative at $t_3$, the packet is either retained by the barrier potential under slave gate portion 25s or flows out through the transfer gate 29 to the sink diode 30. A new data packet is thereafter entered at the start of the $t_4$ interval (diagram f).

Figure 5:
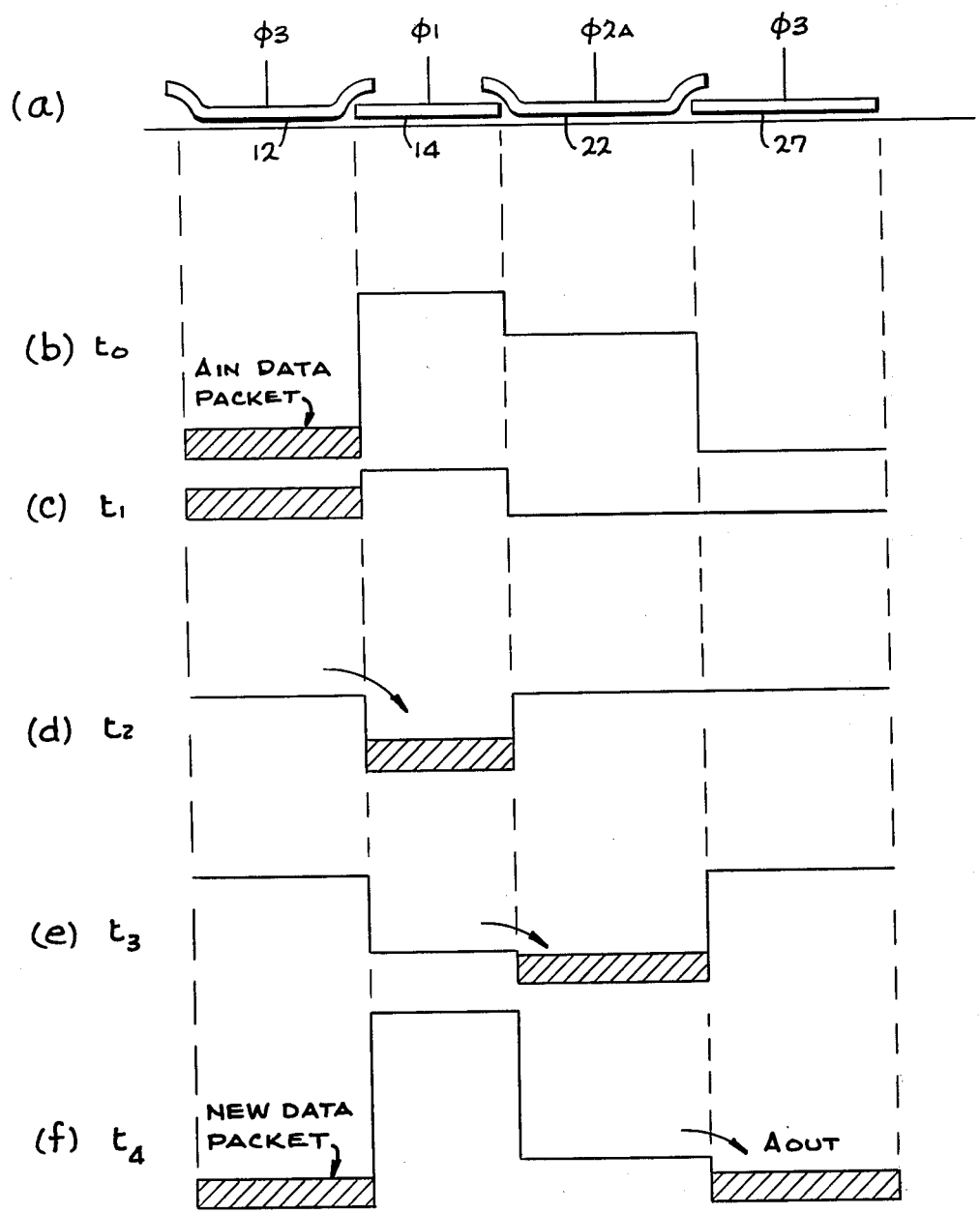
FIG. 5 is a simplified graphical representation of bias levels and minimum potentials utilized in a third channel in the arrangement of FIG. 1.

Flow in the regenerator or refresh channel is illustrated sequentially in FIG. 5, as to which one particular fact should be noted. That is that the $A_{in}$ data packet under gate 12, if present, is overflowed across the storage electrode 14. Thus only the standardized data packet is entered at $t_2$ under electrode 14, and subsequently transferred (or not transferred dependent upon the overflow) under the transfer electrode at $\phi 2A$ (diagram $t_3$) and then the output transfer electrode 27 at $\phi 3$ as the $A_{out}$ signal.

Those skilled in the art will recognize that, when the slave gate portion 25s functions in the transfer mode the signal that is provided is the complement of the input signal or $A_{out}$. Whether transferred via the shunt path or via the in-line path, the output signal is of full unity value. Consequently, the inverted output can be made available at $\phi 3$ simply by substituting an appropriate output transfer electrode for the sink diode 30.

If also an output transfer gate is substituted for the sink diode, and a separate digital input is substituted for the source diode, as for example a shift register that supplies a different binary valued signal representation in the form of a presence or absence of a charge packet, then it can be seen that the system of FIG. 1 represents a half adder, with the carry signal being generated from the output transfer gate 27, and the sum signal being generated from the transfer gate 29. Again, the carry signal, which represents the presence of two binary 1 valued inputs, is fully regenerated. The sum signal, which represents the presence of a binary 1 valued signal at either input, but not both, is not regenerated, but could be applied to a regenerator circuit as specifically shown in FIG. 1. If both input signals are binary 0's and no charge packets are applied, then both output signals will be binary 0's — that is, the absence of charge packets.

Figure 6:
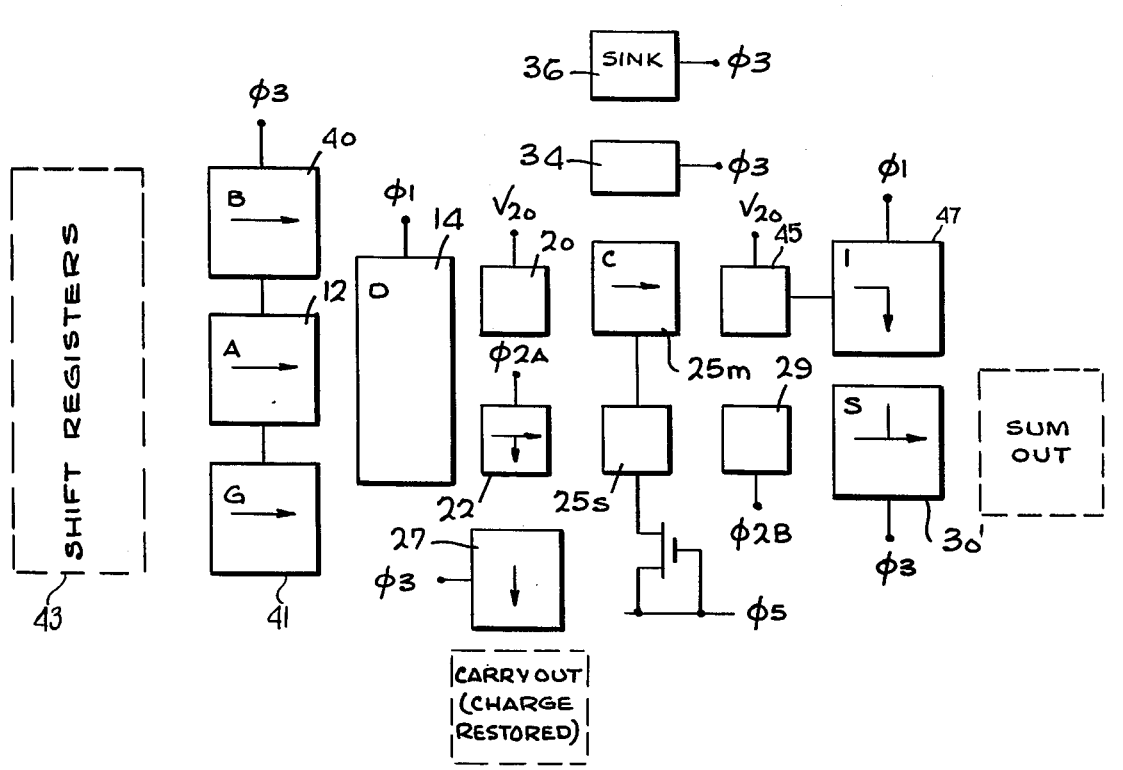
FIG. 6 is a block diagram representation of a full adder incorporating automatic regeneration in accordance with the invention.
Figure 7:
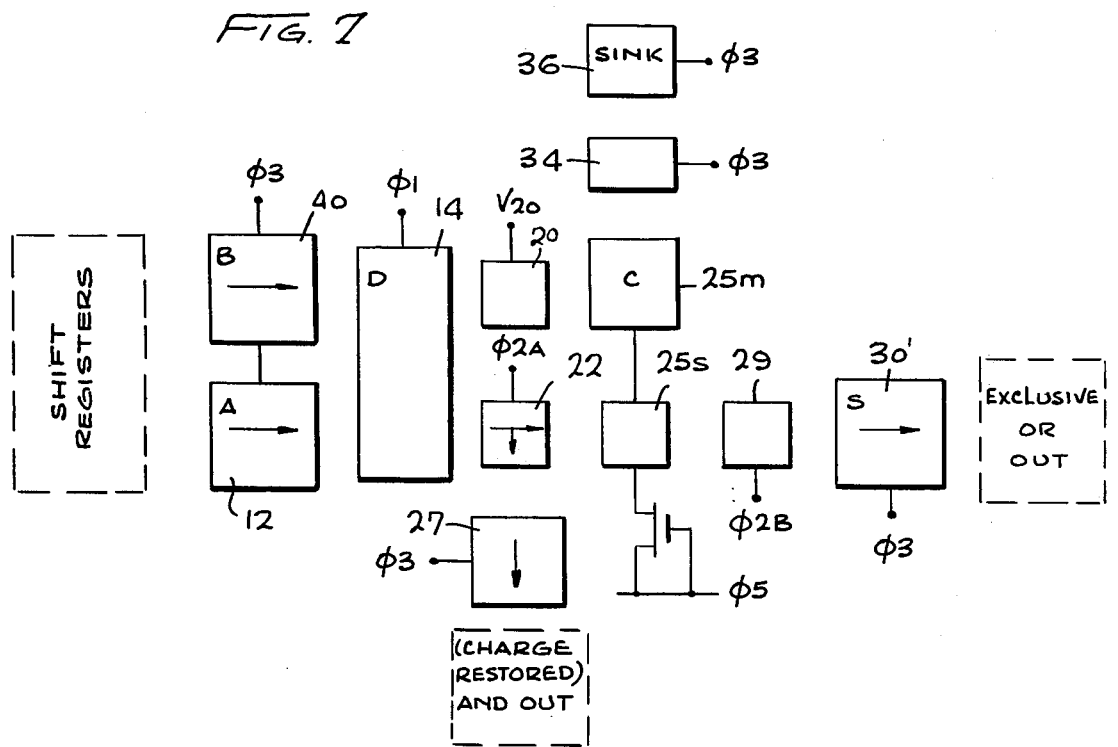
FIG. 7 is a block diagram of an AND and EXCLUSIVE-OR circuit in accordance with the invention.

In FIGS. 6 and 7, the circuits depicted use functional gating blocks which are numbered to correspond to the like elements or units of the charge regenerator circuit of FIG. 1. Inasmuch as the arrangements and relationships are essentially the same except for certain added input and output transfer gates, it is unnecessary to repeat the prior description except in general terms. Thus in the full adder of FIG. 6, three input transfer gates 12, 40 and 41, designated A, B and G respectively, receive from associated shift registers 43 input charge packets representing by their presence or absence two input digits and a prior carry digit of binary value. The concurrent presence of more than one charge packet in these input channels causes overflow of the storage electrode 14, which as before can retain only one charge packet.

Basically, when no more than two charge packets are applied the function needed is that of the half adder, and the elements in the circuit of FIG. 1 function as previously described. That is, if only one of the inputs is represented by a charge packet, the shunt path through the slave gate portion 25s and the gate 29 to an output gate 30' substituted for the sink diode 30 is used for charge transfer. The sum output signal (lowest order digit) does not have regenerated charge packets but does appear at this output gate 30'. On the other hand, if charge packets are present at any two inputs, then the slave gate portion 25s functions as a barrier gate, and carry output is provided from the output transfer gate 27 (which is not shown in the in-line configuration for simplicity in this example). The overflow charge shifted under the master gate portion 25m is transferred out through the gate 34 to the sink 36, indicating the most significant digit output for two binary 1 valued inputs.

When three charge packets are concurrently applied (three binary 1's are to be added), the overflow above a single charge packet is transferred from the master gate portion 25m at $\phi 1$ to a transfer gate 47 via a transfer gate 45 held at the $V_{20}$ bias level. Consequently, what may be called the double overflow condition permits coupling of the excess charge packet (beyond a single overflow packet) into yet another channel. This channel transfers charge from gate 47 during the most negative level of $\phi 3$ to the output transfer gate 30' carrying the sum output charge packet. Concurrently, the carry output signal is provided from the output transfer gate 27, as required to provide both the most significant and least significant output digits from the full adder.

FIG. 7 again is based on the regenerator circuit of FIG. 1, and corresponds to the half adder circuit previously described, but arranged to provide the EXCLUSIVE-OR and AND functions concurrently, with signal regeneration at the AND output. When the two input gates 12, 40 each carry a charge packet (binary 1) the AND function is satisfied by shifting of a fully regenerated charge packet to the output transfer gate 27. If either, but not both inputs are a binary 1, then the charge packet is shifted via the shunt path to the output transfer gate 30'.

This adaptability of the basic circuit to a variety of logical and arithmetic functions substantially simplifies some aspect of CCD system design. Because some of the functions may be concurrently provided and regeneration is automatically included for at least one function, useful increases in density and reliability can be obtained.

While various forms of regenerator circuits have been described and illustrated, it shoulld be appreciated that the invention is not limited thereto but encompasses all forms and variations within the scope of the appended claims.

What is claimed is:

1. A regenerator circuit for charge coupled devices, for receiving at least a pair of charge packet inputs, at least one of which represents binary valued input data by the presence or absence of a charge packet which may be diminished from nominal value, and for providing a regenerated charge packet without inversion comprising the combination of:

storage electrode means for receiving the charge packet inputs, the storage electrode means overflowing all charge in excess of a charge packet of the nominal value;

output transfer gate means coupled to said storage electrode means for receiving charge packets of nominal value therefrom;

and sensing gate means including overflow detecting means coupled to said storage electrode means and shunt channel means responsive to said overflow detecting means and coupled to said output transfer gate means, to shunt charge packets of nominal value from said output transfer gate means in the absence of an overflow condition, whereby a charge packet of diminished value is regenerated at nominal value.

2. The invention as set forth in claim 1 above, wherein said circuit further comprises second transfer gate means coupling said storage electrode means to said sensing gate means, and biased to provide overflow thereto, and charge dissipating means coupled to said sensing gate means.

3. The invention as set forth in claim 2 above, including in addition charge transfer means coupled to said sensing gate means to form a shunt transfer channel, and means coupled to maintain said sensing gate means at a selected bias level.

4. The invention as set forth in claim 3 above, wherein said sensing gate means comprises floating gate means including a master gate portion and a slave gate portion coupled to said second transfer gate means.

5. A regenerator circuit for charge-coupled devices comprising:
means providing a first charge packet;
storage electrode means coupled to receive the first charge packet and an attenuated charge packet that is to be regenerated;
first transfer gate means coupled to said storage electrode means for receiving as overflow therefrom all charge in excess of a standardized charge packet;
second transfer gate means coupled to said storage electrode means for receiving standardized charge packets therefrom; and
means including sensing gate means coupled to said first transfer gate means and to said second transfer gate means, and responsive to the absence of an overflow charge at said first transfer gate means for shunting charge packets from said second transfer gate means and being further responsive to the presence of an overflow charge for acting as a barrier means, whereby an overflow charge of less than standardized charge packet size permits output of a standardized charge from said second transfer gate means.

6. The invention as set forth in claim 5 above, wherein said sensing gate means comprises gate means having a master gate portion coupled to said first transfer gate means and a slave gate portion coupled to said second transfer gate means, and said slave gate portion defines a shunt channel in the absence of overflow.

7. The invention as set forth in claim 6 above, wherein said circuit further comprises phase control means coupled to said storage electrode means and said first and second transfer gate means for advancing charge packets along said circuit.

8. The invention as set forth in claim 7 above, wherein said system further comprises means coupled to said sensing gate means and to said phase control means for dissipating charges in the sensing gate region after the charge packet has been regenerated.

9. The invention as set forth in claim 7 above, wherein said system further comprises means coupled to said slave gate means and said phase control means for dissipating charges in the slave gate region after the charge packet has been regenerated.

10. The invention as set forth in claim 9 above, wherein said means providing a standardized charge packet comprises diode means, a pair of serially coupled transfer gates coupled to the diode means, and means coupled to differentially bias the transfer gates such that after activation of the diode means a standardized charge packet determined by the biasing differential is stored under the second of the serial transfer gates.

11. The invention as set forth in claim 10 above, including in addition third transfer gate means coupled to said second transfer gate means and responsive to the phase control means for providing output charge packets from the circuit.

12. The invention as set forth in claim 5 above, wherein said storage electrode means is configured to store no more than a standardized charge packet, and wherein said sensing gate means includes slave gate means coupled to said second transfer gate means.

13. A system using charge coupled devices for providing logic functions with automatic regeneration of a full charge packet from a diminished charge packet whose presence represents one binary value and whose absence represents the other binary value comprising:
storage means having a full charge packet storage capacity and coupled to receive a diminished charge packet representing a binary value;
means coupled to said storage means for injecting a second charge packet into said storage means concurrently with reception of a binary-valued packet;
sensing gate means coupled to said storage means and coupled to receive overflow therefrom;
transfer gate means coupled to said storage means and normally transferring charge packets from said storage means as output; and
shunt channel means coupled to said sensing gate means and responsive to the overflow of a charge packet from said storage means and coupled to shunt charge packets from said transfer gate means in the absence of overflow such that a full charge packet having a binary value is outputed from said transfer gate means when overflow is present.

14. The invention as set forth in claim 13 above, wherein said system includes means providing at least three sources of data signals, and further including transfer gate means coupled to said sensing gate means to receive overflow therefrom that is in excess of one charge packet, and means for coupling the excess overflow into the shunt channel means.

* * * * *

UNITED STATES PATENT AND TRADEMARK OFFICE
CERTIFICATE OF CORRECTION

PATENT NO. :     4,135,104

DATED      :     January 16, 1979

INVENTOR(S) :    Reginald A. Allen

It is certified that error appears in the above-identified patent and that said Letters Patent are hereby corrected as shown below:

Column 2, line 16, "Deviced" should read --Devices--. Column 3, line 46, "output" should read --input--. Column 6, line 10, "cros-sections" should read --cross-sections--; line 32, after "Consequently" insert a comma (--,--); line 48, after "portion" and before "25m" strike the comma (","). Column 7, line 20, "$A_{out}$" should read --$\overline{A_{out}}$--

Column 8, line 43, "shoulld" should read --should--.

Signed and Sealed this

Third Day of April 1979

[SEAL]

Attest:

RUTH C. MASON
Attesting Officer

DONALD W. BANNER
Commissioner of Patents and Trademarks